(12) United States Patent
Lyoo et al.

(10) Patent No.: US 8,147,633 B2
(45) Date of Patent: Apr. 3, 2012

(54) CERAMIC LAMINATE AND METHOD OF MANUFACTURING CERAMIC SINTERED BODY

(75) Inventors: Soo Hyun Lyoo, Yongin (KR); Yong Seok Choi, Suwon (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 13/175,813

(22) Filed: Jul. 1, 2011

(65) Prior Publication Data

US 2011/0277912 A1 Nov. 17, 2011

Related U.S. Application Data

(62) Division of application No. 12/510,162, filed on Jul. 27, 2009, now Pat. No. 7,998,561.

(30) Foreign Application Priority Data

Oct. 23, 2008 (KR) .................. 10-2008-0104468
May 26, 2009 (KR) .................. 10-2009-0045995

(51) Int. Cl.
*C03C 29/00* (2006.01)
*C03C 1/00* (2006.01)

(52) U.S. Cl. ....... 156/89.12; 501/32; 174/256; 174/258; 428/210; 428/426; 428/432

(58) Field of Classification Search .............. 156/89.12; 501/32; 428/210, 426, 432; 174/256, 258

See application file for complete search history.

(56) References Cited

U.S. PATENT DOCUMENTS

| | | | |
|---|---|---|---|
| 5,102,720 A | 4/1992 | Raj | |
| 6,306,511 B1 | 10/2001 | Nakao et al. | |
| 6,337,123 B1 | 1/2002 | Ryugo et al. | |
| 6,426,551 B1 | 7/2002 | Kawakami et al. | |
| 6,468,640 B2 * | 10/2002 | Nishide et al. | 428/210 |
| 6,517,924 B1 | 2/2003 | Kameda et al. | |
| 6,588,097 B2 * | 7/2003 | Nishide et al. | 29/832 |

(Continued)

FOREIGN PATENT DOCUMENTS

JP 07-330445 12/1995

(Continued)

OTHER PUBLICATIONS

Office Action in co-pending Korean Patent Application No. 10-2009-0045995 with English Translation, dated Sep. 8, 2011.

*Primary Examiner* — Cathy Lam
(74) *Attorney, Agent, or Firm* — McDermott Will & Emery LLP

(57) ABSTRACT

There are provided a method of manufacturing a ceramic sintered body. A method of manufacturing a ceramic sintered body according to one aspect of the invention may include: preparing at least one ceramic sheet having first ceramic particles and glass particles; preparing at least one constraining sheet having second ceramic particles having a smaller particle size than the glass particles and the first ceramic particles; forming a ceramic laminate by alternating the ceramic sheet and the constraining sheet while the ceramic sheet and the constraining sheet are in contact with each other; and sintering the ceramic laminate so that components, which do not react with the first ceramic particles, from the glass particle are moved into the constraining sheet to sinter the constraining sheet when the ceramic sheet is sintered.

10 Claims, 2 Drawing Sheets

U.S. PATENT DOCUMENTS 6,776,861 B2  8/2004  Wang et al.

FOREIGN PATENT DOCUMENTS

| JP | 2000-025157 A | 1/2000 |
| JP | 2001-135933 A | 5/2001 |
| JP | 2001-291955 A | 10/2001 |
| JP | 2002-094244 A | 3/2002 |
| JP | 2002-160977 A | 6/2002 |
| JP | 2007-197312 | 8/2007 |
| JP | 2008-030995 A | 2/2008 |
| JP | 2008-031005 | 2/2008 |
| JP | 2008-042057 A | 2/2008 |

* cited by examiner

CERAMIC LAMINATE AND METHOD OF MANUFACTURING CERAMIC SINTERED BODY

CROSS-REFERENCE TO RELATED APPLICATIONS

This application is a divisional of U.S. application Ser. No. 12/510,162, filed on Jul. 27, 2009, which claims the priority of Korean Patent Application No. 10-2008-0104468, filed on Oct. 23, 2008, and Korean Patent Application No. 10-2009-0045995, filed on May 26, 2009, in the Korean Intellectual Property Office, the disclosure of all of which is incorporated herein by reference.

BACKGROUND OF THE INVENTION

1. Field of the Invention

The present invention relates to a ceramic laminate and a method of manufacturing a ceramic sintered body.

2. Description of the Related Art

In general, multilayer ceramic substrates have been used as components on which active elements, such as semiconductor IC chips, and passive elements, such as capacitors, inductors and resistors, are mounted. Also, multilayer ceramic substrates have simply been used in semiconductor IC packages. Specifically, these multilayer ceramic substrates have been widely used to construct various electronic components including PA module substrates, RF diode switches, filters, chip antennas, various package components and complex devices.

In order to manufacture the above-described multilayer ceramic substrates, dielectric sheets having wiring conductors formed thereon are laminated, and the sintering process is necessarily performed on the laminate to achieve optimum characteristics. However, after this sintering process is performed, the multilayer ceramic substrates shrink because ceramics are sintered. Since multilayer ceramic substrates do not shrink evenly in all directions, dimensional changes occur in the planar direction of ceramic layers. The shrinkage of the ceramic substrate in the planar direction also causes undesirable deformations or distortions. Specifically, the accuracy of external electrodes for connections with chip components, which are mounted onto multilayer ceramic substrates, may be reduced or wiring conductors may be disconnected.

The shrinkage of the ceramic substrate in the planar direction causes a misalignment between conductor patterns and the ceramic substrate when mounting components. As a result, it may be impossible to mount semiconductor chips, such as chip size packages (CSPs) and MCM (multi-chip modules), with high accuracy. Therefore, there has been proposed a so-called non-shrinking method in order to remove shrinkage in the planar direction in a sintering process when multilayer ceramic substrates are manufactured.

According to a general non-shrinking method, constraining sheets are formed using alumina powder, which is a ceramic that is not sintered at 900° C. or less, the formed constraining sheets are laminated on the top and bottom of low temperature co-fired ceramic (LTCC) dielectric sheets to form a ceramic substrate, a predetermined weight is applied to the ceramic substrate to perform plasticizing and sintering, and then the constraining sheets are removed therefrom, thereby obtaining a ceramic substrate. FIG. 1 is a cross-sectional view illustrating one process of a general non-shrinking method of manufacturing a ceramic substrate. Constraining layers 11 are disposed on the top and bottom of a ceramic laminate 10 that has a plurality of ceramic sheets laminated onto one another. Here, each of the constraining layers 11 is not sintered at a sintering temperature of the ceramic laminate 10. The constraining layers 11 can prevent shrinkage in the planar direction of the ceramic laminate 10 during the sintering process.

However, in the non-shrinking method, illustrated in FIG. 1, a large constraining force is applied to ceramic sheets adjacent to the constraining sheets 11, but a relatively small constraining force is applied to the inner part of the ceramic laminate 10. Since the constraining force is unevenly applied to the ceramic laminate 10, a stress imbalance occurs in the inner part of the ceramic laminate 10. As a result, the reliability of the ceramic substrate may be deteriorated. This problem may be worsened when the ceramic laminate 10 is thick.

SUMMARY OF THE INVENTION

An aspect of the present invention provides a ceramic laminate having constraining layers that can evenly exert a constraining force onto a ceramic laminate during sintering.

Another aspect of the present invention provides a method of manufacturing a ceramic sintered body that is obtained by sintering the ceramic laminate.

According to an aspect of the present invention, there is provided a ceramic laminate including: at least one ceramic sheet having first ceramic particles and glass particles; and at least one constraining sheet having second ceramic particles and alternating with the ceramic sheet while the constraining sheet and the ceramic sheet are in contact with each other, wherein the glass particles and the first ceramic particles each have a larger particle size than the second ceramic particles, and the first ceramic particles have a particle size of 1 μm or more, the glass particles have a particle size within the range of 1 μm to 10 μm, and the second ceramic particles have a particle size of 1 μm or less.

The ceramic sheet and the constraining sheet may each include a conductive pattern and a conductive via.

The ceramic sheet may have a thickness within the range of 20 μm to 200 μm.

The constraining sheet may have a thickness of 20 μm or less.

The ceramic sheet may be thicker than the constraining sheet.

The first and second ceramic particles may be formed of the same material.

The constraining sheet may include the second ceramic particles and organic binders.

The glass particles may include a composition represented by (Ca, Sr, Ba)O—$Al_2O_3$—$SiO_2$—ZnO—$B_2O_3$.

The first ceramic particles may include $Al_2O_3$.

The ceramic sheet may include 40 to 80 wt % of the glass particles and 20 to 60 wt % of the first ceramic particles.

The glass particles include 2 to 10 wt % of ZnO.

According to another aspect of the present invention, there is provided a method of manufacturing a ceramic sintered body, the method including: preparing at least one ceramic sheet having first ceramic particles and glass particles; preparing at least one constraining sheet having second ceramic particles having a smaller particle size than the glass particles and the first ceramic particles; forming a ceramic laminate by alternating the ceramic sheet and the constraining sheet while the ceramic sheet and the constraining sheet are in contact with each other; and sintering the ceramic laminate so that components, which do not react with the first ceramic particles, from the glass particle are moved into the constraining sheet to sinter the constraining sheet when the ceramic sheet is sintered.

The constraining sheet may be sintered after the ceramic sheet is sintered.

The constraining sheet may be sintered at the sintering temperature of the ceramic sheet.

The glass particles may include a composition represented by $(Ca, Sr, Ba)O—Al_2O_3—SiO_2—ZnO—B_2O_3$.

The first ceramic particles may include $Al_2O_3$.

The ceramic sheet may include 40 to 80 wt % of the glass particles and 20 to 60 wt % of the first ceramic particles.

The glass particles may include 2 to 10 wt % of ZnO.

Components, which do not react with the first ceramic particles, may include ZnO.

The first ceramic particles may have a particle size of 1 μm or more, the glass particles may have a particle size within the range of 1 μm to 10 μM, and the second ceramic particles may have a particle size of 1 μm or less.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
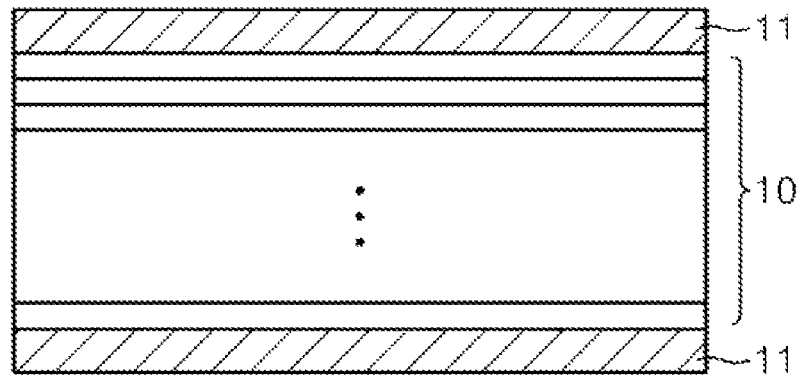
FIG. 1 is a cross-sectional view illustrating one process of a general non-shrinking method of manufacturing a ceramic substrate.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 2:
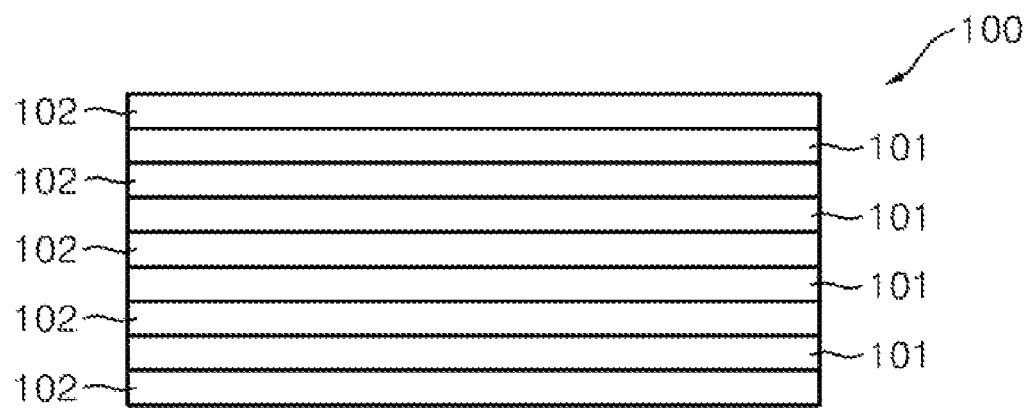
FIG. 2 is a cross-sectional view illustrating a ceramic laminate according to an exemplary embodiment of the invention.
Figure 3:
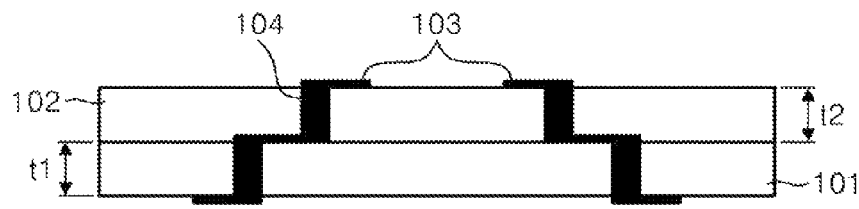
FIG. 3 is a detailed view illustrating a ceramic sheet and a constraining sheet of the ceramic laminate, shown in FIG. 2.

FIG. 2 is a cross-sectional view illustrating a ceramic laminate according to an exemplary embodiment of the invention. FIG. 3 is a detailed view illustrating a ceramic sheet and a constraining sheet of the ceramic laminate, shown in FIG. 2. First, referring to FIG. 2, a ceramic laminate 100 according to this embodiment includes ceramic sheets 101 and constraining sheets 102. The ceramic sheets 101 and the constraining sheets 102 alternate with each other while they are bonded to each other. The ceramic sheets 101 may be formed using glass, ceramic fillers and organic binders by the doctor blade method known in the related art. The constraining sheets 102 include glass ceramic fillers and organic binders and a very small amount of glass so that the constraining sheets 102 cannot be sintered at the sintering temperature of the ceramic sheets 101. These constraining sheets 102 can exert a constraining force onto the ceramic sheets 101 during sintering.

As described above, unlike the related art, in the ceramic laminate 100, each of the constraining sheets 102 is disposed between the ceramic sheets 101. The constraining sheets 102 remain in the final device, that is, a ceramic sintered body. To this end, as shown in FIG. 3, conductive patterns 103 and conductive vias 104 may be provided in the ceramic sheets 101 and the constraining sheets 102.

As the constraining sheets 102 are in contact with the top and bottom of each of the ceramic sheets 101, the constraining force can be evenly exerted onto the ceramic sheets 101 to thereby prevent a stress imbalance. Furthermore, since the constraining sheets 102 do not need to be removed after the sintering process, processing convenience can be significantly increased. As it will be described below, even though glass particles are moved within the constraining sheets 102 during the sintering process, an excessive volume of the constraining sheets 102 having a high proportion of ceramic fillers may deteriorate properties of a ceramic sintered body after the sintering process, that is, a ceramic substrate. Therefore, the above-described constraining sheet may have a thickness t2 of 20 μm or less, preferably, 10 μm or less. The ceramic sheet 101 has a thickness t1 within the range of 20 μm to 200 μm.

Figure 4:
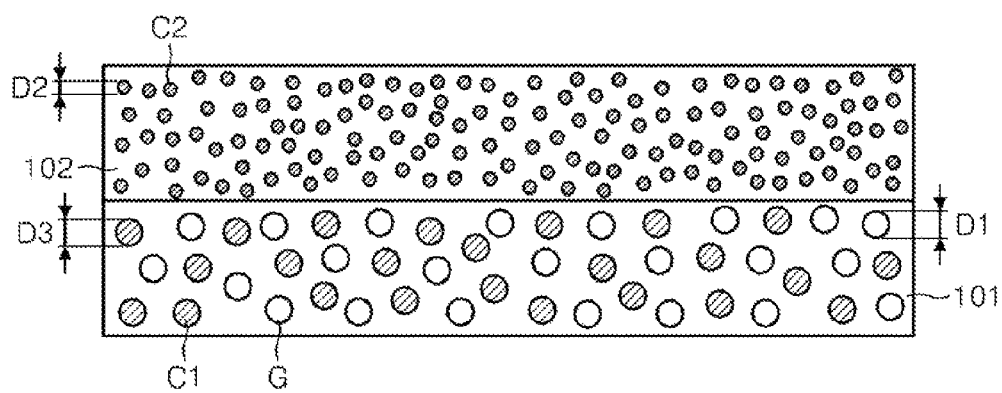
FIG. 4 is an enlarged view illustrating particles constituting a ceramic sheet and a constraining sheet.
Figure 5:
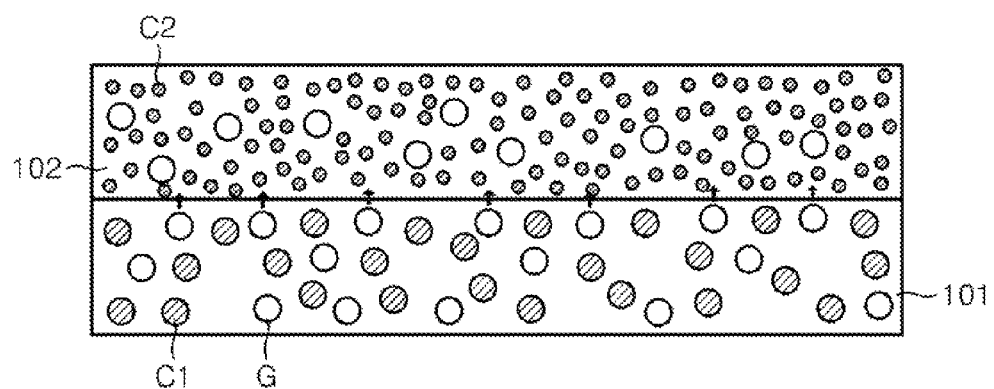
FIG. 5 is an enlarged view illustrating particles constituting a ceramic sheet and a constraining sheet.

As described above, the constraining sheets 102 include ceramic fillers that are not sintered at the sintering temperature of the ceramic sheets 101. However, as the ceramic sheets 101 start to be sintered, the constraining sheets 102 may also be sintered at a relatively low temperature. This will be described with reference to FIGS. 4 and 5. FIGS. 4 and 5 are views enlarging particles constituting a ceramic sheet and a constraining sheet. Here, in FIG. 4, the ceramic laminate 100, shown in FIG. 2, is kept at a temperature less than the sintering temperature, and in FIG. 5, glass particles are being moved during the sintering process. During the sintering process of the ceramic sheets 101, when the constraining sheets 102 are not sintered, and then start to be sintered at a temperature much higher than the sintering temperature of the ceramic sheets 101, the sintering state of the ceramic sheets 101, which have already been sintered, may be deteriorated. Considering this, in this embodiment, glass particles are moved into the constraining sheets 102 while the ceramic sheets 101 are sintered.

If glass particles G, partially constituting the ceramic sheets 101, are moved into the constraining sheets 102 during the sintering process, the sintering temperature of the constraining sheets 102 is gradually reduced, and thus the constraining sheets 102 may be sintered at a temperature close to the sintering temperature of the ceramic sheets 101. Therefore, the ceramic sintered body can be obtained in which the ceramic laminate 100 is evenly sintered. To this end, a diameter D1 of each of the glass particles G and a diameter D3 of each of the ceramic particles (first ceramic particles C1) constituting the ceramic fillers that are included in the ceramic sheets 101 need to be larger than a diameter D2 of each of the ceramic particles (second ceramic particles C2) that are included in the constraining sheets 102. As shown in FIG. 5, this helps to promote the movement of the glass particles G by capillary action. Specifically, the particle diameter D1 of each of the glass particles G may be within the range of 1 μm to 10 μm, preferably, around 2.5 μm. The first ceramic particles C1 may be of similar size to the glass particles G in terms of sintering characteristics. Preferably, the particle diameter D3 of the ceramic particle may be 1 μm or more. Considering this, the particle diameter D2 of the second ceramic particle C2 may be 1 μm. Here, since the plurality of glass particles G and the first and second ceramic particles C1 and C2 exist, the particle diameter can be defined as a mean particle diameter.

Since the glass penetrates into the constraining sheets 102 during the sintering process, the second ceramic particles C2, included in the constraining sheets 102, are preferably formed of a material that has relatively higher wettability with respect to the glass of the ceramic sheets 101. The same applies to the first ceramic particles C1. When unreacted glass materials remain among the glass particles G during the sintering process, these unreacted glass materials may be easily moved into the constraining sheets 102. Considering these factors, the glass particles G may be formed of a composition represented by (Ca, Sr, Ba)O—$Al_2O_3$—$SiO_2$—ZnO—$B_2O_3$, and the first ceramic particles C1 may be formed of $Al_2O_3$. Here, the glass particles G and the first ceramic particles C1 are mixed while the glass particles G are added at a ratio of 40 to 80 wt % of (Ca, Sr, Ba)O—$Al_2O_3$—$SiO_2$ and the first ceramic particles C1 are added at a ratio of 20 to 60 wt % of $Al_2O_3$ with respect to the ceramic sheets 101.

During the sintering process, glass, containing large amounts of Zn and B, is introduced into the constraining sheets 102 from the ceramic sheets 101. Here, as described, the glass, introduced into the constraining sheets 102, is left without making a reaction to the first ceramic particles C1. The glass, introduced into the constraining sheets 102, results in a pore-free interface between the ceramic sheets 101 and the constraining sheets 102. Specifically, during the sintering process, when (Ca, Sr, Ba)O—$Al_2O_3$—$SiO_2$-based glass reacts with $Al_2O_3$, (Ca, Sr, Ba)$Al_2Si_2O_8$, unreacted glass components are obtained. In the above reaction, ZnO mostly becomes unreacted glass components. Here, a crystal of (Ca, Sr, Ba)$Al_2Si_2O_8$ rarely contains ZnO. Crystallographically, since an ionic radius of each of the elements, such as Ca, Sr and Ba, is much larger than that of Zn, Zn is difficult to substitute for the elements. Therefore, the glass components containing large amounts of Zn are moved into the constraining sheets 102 during the sinter process of the ceramic sheets 101. That is, glass particles G', having moved to the constraining sheets 102, shown in FIG. 5, are different from the glass particles G that have existed in the ceramic sheets 101.

The glass components containing the large amounts of Zn, having moved into the constraining sheet 102, react with the second ceramic particles C2, for example, $Al_2O_3$, a crystalline phase, such as $ZnAl_2O_4$, is precipitated. As this reaction occurs, the unreacted glass in the ceramic sheet 101 is introduced into the constraining sheet 102 at a higher rate. Herein, the constraining sheets 102 are sintered. When ZnO is added to the (Ca, Sr, Ba)O—$Al_2O_3$—$SiO_2$-based glass, the content of ZnO needs to be appropriately controlled. For example, $SiO_2$ is added at a ratio of 40 to 70 wt %, $Al_2O_3$ is added at a ratio of 5 to 20 wt %, (Ca, Sr, Ba)O is added at a ratio of 10 to 35 wt %, $Ba_2O_3$ is added at a ratio of 5 to 15 wt %, ZnO is added at a ratio of 2 to 10 wt % by weight of the glass particles G. When the ZnO content is 2 wt % or higher, this ensures high fluidity of the glass of the ceramic sheet 101, and thus, the remaining space of the ceramic sheets 101 after glass is introduced into the constraining sheets 102 can be filled with the glass. However, when the amount of ZnO increases considerably, basic properties of the LTCC materials, including strength, chemical resistance and insulation, may be adversely affected. Therefore, the content of ZnO does not preferably exceed 10 wt %.

The inventors of this invention have carried out experiments under various conditions to find out the effects of the invention. That is, the inventors sintered ceramic laminates and measured contraction ratios, and the results are shown in Table 1 as follows.

TABLE 1

| | Ceramic sheet | | | | Constraining layer | | | |
|---|---|---|---|---|---|---|---|---|
| | thickness | Particle size (G) | Particle size (C1) | Fraction size (C1) | thickness | Particle (C2) | Sintering temperature | Contraction ratio |
| 1 | 50 μm | 2.5 μm | 1.7 μm | 35 wt % | 6.5 μm | 600 nm | 850° C. | 0.342 |
| 2 | 50 μm | 2.5 μm | 1.7 μm | 35 wt % | 6.5 μm | 600 nm | 870° C. | 0.258 |
| 3 | 50 μm | 2.5 μm | 1.7 μm | 35 wt % | 6.5 μm | 600 nm | 900° C. | 0.183 |
| 4 | 100 μm | 2.5 μm | 1.7 μm | 50 wt % | 6.5 μm | 600 nm | 850° C. | 0.500 |
| 5 | 100 μm | 2.5 μm | 1.7 μm | 50 wt % | 6.5 μm | 600 nm | 870° C. | 0.458 |
| 6 | 100 μm | 2.5 μm | 1.7 μm | 50 wt % | 6.5 μm | 600 nm | 900° C. | 0.183 |
| 7 | 50 μm | 2.5 μm | 2.5 μm | 40 wt % | 6.5 μm | 600 nm | 850° C. | 0.658 |
| 8 | 50 μm | 2.5 μm | 2.5 μm | 40 wt % | 6.5 μm | 600 nm | 870° C. | 0.483 |
| 9 | 50 μm | 2.5 μm | 2.5 μm | 40 wt % | 6.5 μm | 600 nm | 900° C. | 0.617 |
| 10 | 50 μm | 4.5 μm | 1.7 μm | 30 wt % | 4.5 μm | 600 nm | 870° C. | 0.370 |
| 11 | 50 μm | 2.5 μm | 1.7 μm | 50 wt % | 4.5 μm | 600 nm | 870° C. | 0.605 |
| 12 | 100 μm | 2.5 μm | 1.7 μm | 50 wt % | 4.5 μm | 600 nm | 870° C. | 0.674 |
| 13 | 100 μm | 2.5 μm | 1.7 μm | 40 wt % | 4.5 μm | 600 nm | 870° C. | 0.277 |
| 14 | 100 μm | 2.5 μm | 1.7 μm | 30 wt % | 4.5 μm | 600 nm | 870° C. | 0.342 |
| 15 | 100 μm | 2.5 μm | 1.7 μm | 40 wt % | 5.5 μm | 500 nm | 870° C. | 0.340 |
| 16 | 100 μm | 2.5 μm | 1.7 μm | 30 wt % | 5.5 μm | 500 nm | 870° C. | 0.407 |

Sample Nos. 1 to 3 are glass for ceramic sheets, which is formed of Ca—Al—Si—O glass. Sample Nos. 4 to 6 and 11 to 16 are formed of Ca—Al—Si—Zn—O glass. Sample Nos. 7 to 9 are formed of Mg—Ca—Si—O glass. Sample No. 10 is formed of Ca—Al—Si—B glass.

As described above, when a non-shrinking method according to the embodiments of the invention is used, a constraining force is evenly exerted onto a ceramic laminate, and constraining sheets are naturally sintered at a temperature around the sintering temperature of ceramic sheets because of the transferral of glass particles to thereby increase sintering characteristics.

As set forth above, according to exemplary embodiments of the invention, a ceramic laminate having constraining sheets that can evenly exert a constraining force onto a ceramic substrate during sintering can be provided. Further, a non-shrinking method according to exemplary embodiments of the invention allows constraining sheets to be naturally sintered at a temperature around the sintering temperature of ceramic sheets because of the transferral of glass particles to thereby increase sintering characteristics. Furthermore, since there is no need to remove constraining sheets after sintering, processing convenience can be significantly increased.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a ceramic sintered body, the method comprising:

preparing at least one ceramic sheet having first ceramic particles and glass particles;

preparing at least one constraining sheet having second ceramic particles having a smaller particle size than the glass particles and the first ceramic particles; and forming a ceramic laminate by alternating the ceramic sheet and the constraining sheet while the ceramic sheet and the constraining sheet are in contact with each other, wherein the glass particles comprise a composition represented by $(Ca, Sr, Ba)O-Al_2O_3-SiO_2-ZnO-B_2O_3$, wherein the ceramic sheet comprises 40 to 80 wt % of the glass particles and 20 to 60 wt % of the first ceramic particles, wherein the 40 to 80 wt % of the glass particles comprise 2 to 10 wt % of ZnO, wherein the constraining sheet does not contain glass particles, wherein the method further comprises:

sintering the ceramic laminate so that ZnO, which does not react with the first ceramic particles, from the glass particles is moved into the constraining sheet to allow the constraining sheet to be sintered while the ceramic sheet is sintered.

2. The method of claim 1, wherein the sintering temperature of the constraining sheet is about the same as the sintering temperature of the ceramic sheet.

3. The method of claim 1, wherein the first ceramic particles comprise $Al_2O_3$.

4. The method of claim 1, wherein the first ceramic particles have a particle size of 1 μm or more, the glass particles have a particle size within the range of 1 μm to 10 μm, and the second ceramic particles have a particle size of 1 μm or less.

5. The method of claim 1, wherein the ceramic sheet and the constraining sheet each comprises a conductive pattern and a conductive via.

6. The method of claim 1, wherein the ceramic sheet has a thickness within the range of 20 μm to 200 μm.

7. The method of claim 1, wherein the constraining sheet has a thickness of 20 μm or less.

8. The method of claim 1, wherein the ceramic sheet is thicker than the constraining sheet.

9. The method of claim 1, wherein the first and second ceramic particles are formed of the same material.

10. The method of claim 1, wherein the constraining sheet comprises the second ceramic particles and organic binders.

* * * * *